United States Patent [19]

Carlson et al.

[11] 4,301,432
[45] Nov. 17, 1981

[54] COMPLEX RF WEIGHTER

[75] Inventors: Richard L. Carlson, Lake in the Hills; Allen L. Davidson, Crystal Lake, both of Ill.

[73] Assignee: Motorola, Inc., Schaumburg, Ill.

[21] Appl. No.: 176,892

[22] Filed: Aug. 11, 1980

[51] Int. Cl.³ ............................. H01P 1/185; H01P 1/22
[52] U.S. Cl. .................................. 333/164; 333/81 R; 333/81 A; 333/263
[58] Field of Search ............ 333/81 A, 81 B, 156–160, 333/164, 263, 245–248, 81 R, 109, 115–123

[56] References Cited

U.S. PATENT DOCUMENTS

| | | | |
|---|---|---|---|
| 3,400,342 | 9/1968 | Putnam | 333/116 X |
| 3,571,762 | 10/1969 | Smilen | 333/116 |
| 3,768,045 | 10/1973 | Chung | 333/109 X |
| 3,996,533 | 12/1976 | Lee | 333/161 X |
| 4,016,516 | 4/1977 | Sauter et al. | 333/81 A X |
| 4,153,886 | 5/1979 | Miedema | 333/156 |
| 4,153,994 | 5/1979 | Ren | 333/157 |
| 4,216,445 | 8/1980 | Abajian | 333/81 R |

Primary Examiner—Marvin L. Nussbaum
Attorney, Agent, or Firm—Donald P. Reynolds; Edward M. Roney; James W. Gillman

[57] ABSTRACT

A complex RF weighter provides an RF output signal controlled in amplitude and phase with respect to an input signal. The input signal is applied to a quadrature hybrid that is terminated with two PIN diodes, one of which is one-eighth wavelength farther from the hybrid than the other. Independent control of the bias on the PIN diodes provides control of the relative amplitude and phase of the output signal.

6 Claims, 4 Drawing Figures

COMPLEX RF WEIGHTER

BACKGROUND OF THE INVENTION

This invention relates to the handling of RF signals. In particular, this invention is a complex weighter for providing an RF signal with controlled phase shift and amplitude.

Many electrical systems that process RF signals require a signal that is synchronized with another RF signal but that differs from it controllably in amplitude, phase, or both. The differences in amplitude and phase may be fixed or they may vary in response to a control signal. An example of such a system is a single-frequency repeater with adaptive cancellation. A major problem in such a system is to separate a received portion of a retransmitted wave (the so-called "blowover" signal) from the much weaker received signal that is to be rebroadcast. One way of neutralizing the effect of such a blowover signal is adaptive cancellation in which a signal corresponding in frequency, amplitude and phase to the output signal is subtracted from the input to leave only a desired received signal. The signal to be subtracted is readily derived from the transmitted signal but, in general, differs from that signal in both amplitude and phase.

Other systems that require synchronized signals differing in amplitude or phase from a reference signal include side-lobe cancellers and sideband noise cancellers. A side-lobe canceller is a receiving system for directing a null in an antenna pattern at a jamming signal. The null is produced by pointing a second directive antenna at the jammer and adjusting its receiving amplitude to be equal to that of the first antenna, but out of phase so as to cancel in a passive summing network. A sideband noise canceller is a system for cancelling an unwanted signal by subtraction.

Various measures of control of RF signals to frequency ranges as high as one gigahertz have been achieved with combinations of microwave couplers and PIN diodes. In some of these applications, the PIN diodes have been biased to appear either as short circuits or as open circuits to terminate portions of couplers with reflection coefficients of $+1$ or $-1$. The result is to make microwave switches that are controlled by external DC sources. None of these applications provides continuous control of amplitude or phase of an RF signal over a range.

It is an object of the present invention to provide a controller for RF signals that produces an externally controllable phase shift.

It is a further object of the present invention to provide a circuit for controlling externally the amplitude of an RF signal.

It is a further object of the present invention to provide a circuit to control both amplitude and phase of an RF signal.

It is a further object of the present invention to perform complex weighting with a minimum number of components.

Other objects will become apparent in the course of a detailed description of the invention.

SUMMARY OF THE INVENTION

In a complex weighter, the amplitude and phase of an RF signal are controlled from a pair of external terminals by connecting the RF signal to a quadrature hybrid. The zero-degree terminal of the quadrature hybrid is terminated with a PIN diode, and the ninety-degree terminal of the quadrature hybrid is also terminated with a PIN diode that is spaced one-eighth wavelength farther from the terminals of the hybrid than the first PIN diode. The isolated terminal of the hybrid carries a signal that is adjustable in both amplitude and phase over a considerable range by adjusting separately the bias currents applied to the PIN diodes. Those bias currents are applied through two separate biasing lines that are decoupled from the RF signal. The weighter is adapted to provide a variable phase shift and change in amplitude in response to a feedback signal at the bias terminals.

DETAILED DESCRIPTION OF THE INVENTION

Figure 1:
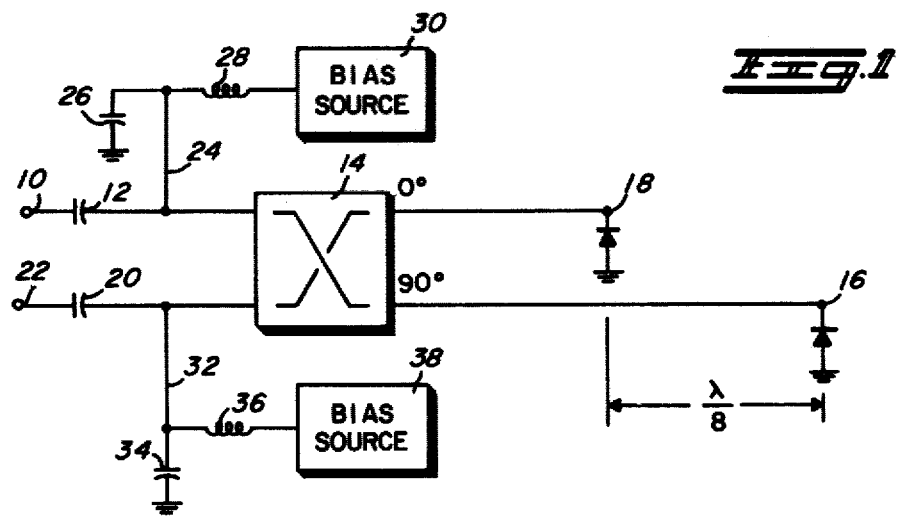
FIG. 1 is a schematic diagram of a circuit for the practice of the invention.

FIG. 1 is a schematic diagram of a circuit for the practice of the present invention. In FIG. 1, input terminal 10 receives an RF signal that is to be applied to the weighter. The RF signal incident at terminal 10 passes through blocking capacitor 12 to the input port of quadrature hybrid 14. The signal path thus formed is terminated by PIN diode 16, connected to what is normally described as the ninety-degree port. The zero-degree port of the quadrature hybrid 14 is terminated by PIN diode 18, and the isolated port of quadrature hybrid 14 is connected through blocking capacitor 20 to form output terminal 22 of the weighter. The RF paths indicated here are represented as lines, but it is evident that they could be coaxial cable, microstrip, or the like. It is also indicated in FIG. 1 that PIN diode 16 is connected to one-eighth wavelength more line than is PIN diode 18. The reason for this will be explained below.

A quarter-wavelength line 24 is connected to the input line and is bypassed to ground at its end by bypass capacitor 26. An RF choke 28 connects line 24 to bias source 30. A DC or slowly varying current supplied by bias source 30 will be coupled through RF choke 28, through quarter-wave line 24 and quadrature hybrid 14 to establish a bias on PIN diode 16. Similarly, a quarter-wave line 32 is bypassed to ground by capacitor 34 and is connected through RF choke 36 to a bias source 38 to bias PIN diode 18. Bias sources 30 and 38 are here shown as blocks to indicate symbolically that they may be conventional DC sources or they may be connected as parts of a feedback circuit to respond to other control means to adjust the phase and amplitude of the RF signal at output terminal 22. The term "bias sources" is used because it is expected that their currents will either be held constant or will vary slowly.

It is a characteristic of PIN diodes that their RF impedance is primarily resistive and that the value of that resistance can be adjusted over a considerable range by varying the DC current that is applied to the PIN diode as a forward bias. That fact enables the terminations of the quadrature hybrid to be varied separately by varying the bias on the diodes to cause the reflection coefficient of each diode to add. Because of the added length of line in one arm, totaling one-quarter wave of distance, signals combine in phase quadrature, thus forming the complex weight.

Figure 2:
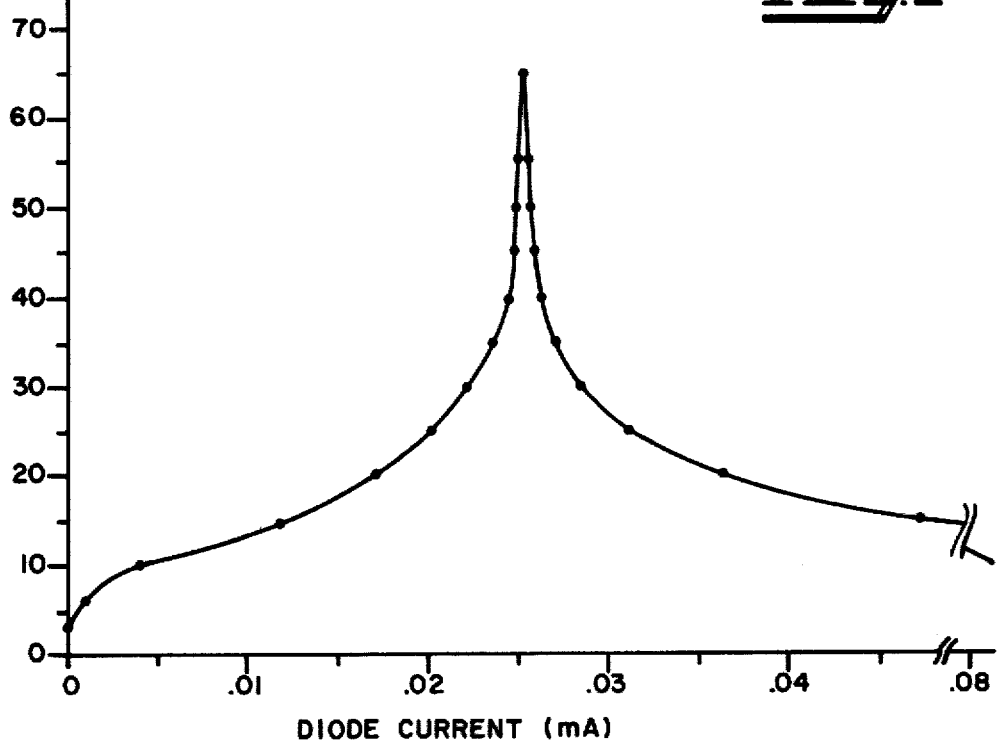
FIG. 2 is a plot of attenuation versus diode current in the circuit of FIG. 1.

A complex weighter has been built and tested at a center frequency of 813.5 MHz. The RF transmission lines were microstrip placed on G-10 dielectric. Both blocking capacitors 12 and 20 were 39 pf and the quadrature hybrid was a Merrimac QHF-2-0.750 GK. A quarter wavelength on G-10 dielectric at the frequency used was 4.32 centimeters. The PIN diodes were Microwave Associates MA 47625. Measurements were made by setting one PIN diode to provide maximum attenuation (i.e. an impedance match) and varying the bias on the other PIN diode to cause the resistance of that PIN diode to vary between an open circuit and a short circuit. FIG. 2 is a plot of the measured attenuation of an RF signal as a function of PIN diode current in one arm with the current in the PIN diode in the other arm set at a value that produced maximum attenuation. The result is to examine each weight component separately as a function of an external DC source. Under these conditions the measured phase shift on the zero-degree arm varied from minus 108 degrees to plus 78 degrees at the center frequency. The phase shift on the ninety-degree arm varied from plus 3 degrees to −170 degrees at the center frequency. Independent variations of the currents supplied by the bias sources 30 and 38 can, therefore, be seen to provide independently shifted signals that are combined to provide an output signal that is variable in a controlled way in both amplitude and phase with respect to the input signal.

Figure 3:
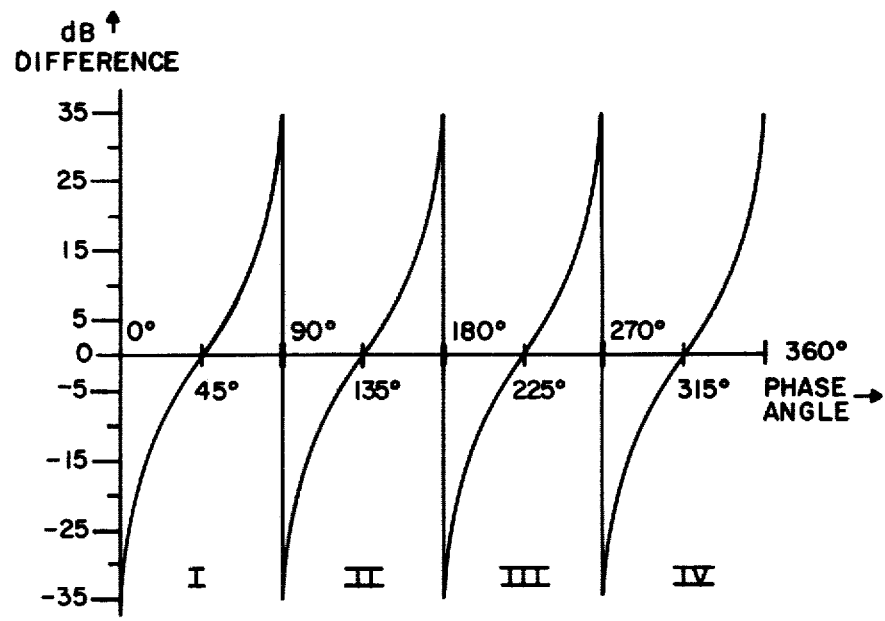
FIG. 3 is a plot of phase angle as a function of differential amplitude in the circuit of FIG. 1.

The phase angle that is obtained with the complex weighter of the present invention is a function of the relative or differential attenuation in the two arms. This is illustrated by FIG. 3 which is a plot of the differential attenuation associated with each angle of the complex weighter. It can be seen from FIG. 3 that any given value of the decibel difference is associated with four different angles. Referring to FIG. 2, those four angles represent the four combinations that occur when each PIN diode is either above or below the maximum attenuation that occurs at about 26 microamperes. The angular region of FIG. 3 that is achieved by each combination of current ranges is summarized in Table 1 which is a comparison of the ranges of current in the PIN diodes with the corresponding region of FIG. 3 that is achieved by those currents.

TABLE 1

Comparison of current ranges in PIN diodes and associated angular ranges of FIG. 3. The maximum value is achieved at 26 microamperes. Input Reference in region I.

| 0° ARM | 90° ARM | REGION OF FIG. 3 |
|---|---|---|
| Above Maximum | Below Maximum | I |
| Above Maximum | Above Maximum | II |
| Below Maximum | Below Maximum | III |
| Below Maximum | Above Maximum | IV |

Referring again to FIG. 2, it is apparent that the most useful range of values of attenuation is between roughly 15 decibels and 50 decibels. If it is desired to have more or less attenuation in the circuit than this, it is a simple matter to connect a fixed pad or an amplifier of constant gain in cascade with the device. For example, if the complex weighter is used to cancel blowover signals in a single-frequency repeater, it is likely that the undesired signal will be down 80 or 90 decibels from the input. This is readily achieved while maintaining adjustability by connecting pads totaling 50 or 60 decibels in cascade with the device. In contrast, sideband noise cancellation may require overall gain of 20 or 30 decibels. This can be achieved by inserting 40 to 60 decibels of amplification in cascade with the device.

Figure 4:
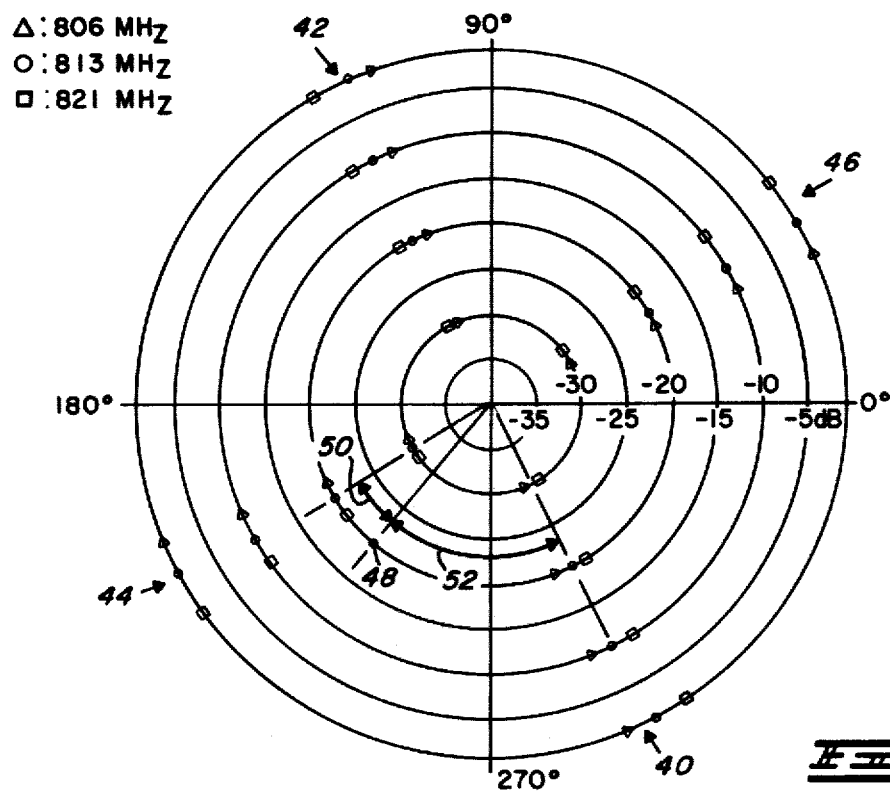
FIG. 4 is a polar plot of attenuation and phase angle as a function of frequency obtained from the circuit of FIG. 1.

The procedure for obtaining a desired weight is here illustrated with reference to FIG. 4, which is a polar plot of attenuation and phase angle obtained from the circuit of FIG. 1. In FIG. 4, the various points are taken for three frequencies, 806 MHz, 813 MHz, and 821 MHz. Points are grouped in regions 40, 42, 44 and 46 according to values of current in PIN diodes 16 and 18. Regions 40 and 42 relate the 0° arm magnitude while regions 44 and 46 relate the 90° arm magnitude. For each region, one of the PIN diodes 16 or 18 is set at 25.3 microamperes, the value shown in FIG. 2 to produce maximum attenuation, and current in the other is varied. Table 2 shows the ranges of current associated with the regions of FIG. 4.

TABLE 2

| | Current ranges for regions of FIG. 4. | |
|---|---|---|
| Region | PIN diode 16 (90°) | PIN diode 18 (0°) |
| 40 | 25.3 microamperes | <25.3 microamperes |
| 42 | 25.3 microamperes | >25.3 microamperes |
| 44 | <25.3 microamperes | 25.3 microamperes |
| 46 | >25.3 microamperes | 25.3 microamperes |

Suppose it is desired to obtain a complex weight of 30 dB below an input signal at an angle of 230° at a frequency of 812 MHz. The corresponding value is marked in FIG. 4 as point 48, and it is evident from inspection of FIG. 4 that point 48 can be achieved by combining values from regions 40 and 44. Reference to Table 2 shows that current in PIN diodes 16 and 18 will be less than 25.3 microamperes. From FIG. 4, point 48 is shifted from region 44, the ninety-degree region of PIN diode 16, by angle 50, and from region 40 by angle 52. These angles are respectively 18° and 66°. The calculations are as follows:

1. Convert −30 dB to a voltage ratio VR.
   −30 = 20 log VR; VR = 0.0316
2. Obtain components in regions 40 and 44.
   Region 40: VR cos (angle 52) = 0.0128
   Region 44: VR cos (angle 50) = 0.030
3. Convert components to dB:
   Region 40: 20 log 0.0128 = −37.8 dB
   Region 44: 20 log 0.030 = −30.4 dB
4. Obtain currents from FIG. 2:
   PIN diode 16: 23.5 microamperes
   PIN diode 18: 22.0 microamperes By following the procedure described above, a complex weight can be achieved between about 10 dB and 50 dB at any phase angle. The desired values of current may be set manually or may be obtained automatically as part of a feedback system.

We claim:

1. A complex weighter for generating from an input RF signal of a given amplitude and phase an output RF signal differing from the input RF signal by a controllable amount in amplitude and phase, the complex weighter comprising:
   a. a quadrature hybrid having an input port, an isolated port, a zero-degree port, and a 90-degree port;

b. a first PIN diode connected to the zero-degree port and to electrical ground;

c. a second PIN diode connected to electrical ground and through a one-eighth-wavelength line to the 90-degree port; and d. means for biasing the first and second PIN diodes;

whereby an RF signal of a given amplitude and phase applied at the input port appears at the isolated port with a different amplitude and phase according to settings of the means for biasing.

2. The apparatus of claim 1 comprising in addition means for blocking RF from the biasing means.

3. The apparatus of claim 2 comprising in addition:

a. an input terminal connected to the input port;

b. an output terminal connected to the isolated port; and c. means for blocking voltages and currents of the biasing means from the input and output terminals.

4. The apparatus of claim 1 wherein the means for biasing comprise means for applying continuously variable currents to the first and second PIN diodes over a range of currents that varies resistance of the PIN diodes above and below a characteristic impedance of the quadrature hybrid.

5. The apparatus of claim 1 comprising in addition a fixed attenuator connected in cascade with one of the input and isolated ports.

6. The apparatus of claim 1 comprising in addition an amplifier of constant gain connected in cascade with one of the input and isolated ports.

* * * * *